(12) United States Patent
Alvi et al.

(10) Patent No.: US 12,185,510 B2
(45) Date of Patent: Dec. 31, 2024

(54) ACTIVE COOLANT FLOW CONTROL IN MULTI-INVERTER SYSTEMS

(71) Applicant: GM GLOBAL TECHNOLOGY OPERATIONS LLC, Detroit, MI (US)

(72) Inventors: Muhammad Hussain Alvi, Troy, MI (US); Ronald O. Grover, Jr., Northville, MI (US); Brian A. Welchko, Oakland Township, MI (US); Chandra S. Namuduri, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 230 days.

(21) Appl. No.: 17/868,969

(22) Filed: Jul. 20, 2022

(65) Prior Publication Data

US 2024/0032264 A1    Jan. 25, 2024

(51) Int. Cl.
*H05K 7/20* (2006.01)
*B60L 1/00* (2006.01)
(Continued)

(52) U.S. Cl.
CPC .......... *H05K 7/20927* (2013.01); *B60L 1/003* (2013.01); *H02M 1/327* (2021.05); *H02M 7/003* (2013.01)

(58) Field of Classification Search
CPC ........ B60L 1/02; B60L 1/003; B60L 2240/36; B60L 2240/525; H05K 7/20927; H05K 7/2089; H02M 1/327; H02M 7/003
See application file for complete search history.

(56) References Cited

U.S. PATENT DOCUMENTS

2014/0262195 A1* 9/2014 Lee ................. B60L 3/0061
165/200
2018/0257480 A1* 9/2018 Zhou ................. B60K 1/04
(Continued)

FOREIGN PATENT DOCUMENTS

| AT | 512492 B1 | 12/2014 |
| CN | 104309469 A | 1/2015 |
| JP | 2012044772 A | 3/2012 |

OTHER PUBLICATIONS

Office Action issued in German Patent Application No. DE10-2023100805.6; Application Filing Date Jan. 14, 2023; Date of Mailing Sep. 19, 2023 (8 pages).

*Primary Examiner* — Len Tran
*Assistant Examiner* — Kamran Tavakoldavani
(74) *Attorney, Agent, or Firm* — CANTOR COLBURN LLP

(57) ABSTRACT

A cooling system for a drivetrain of an electric vehicle includes a coolant circuit directing a flow of coolant through a first inverter and a second inverter of the drivetrain, and an adjustable flow valve positioned along the coolant circuit to selectably alter proportions of the flow of coolant directed through each of the first inverter and the second inverter. A method of operating a cooling system for a first inverter and a second inverter of a vehicle drivetrain includes commanding a speed and torque of each of the first and second inverter, and estimating losses and temperature of each of the first inverter and the second inverter as a result of the commanded speed and torque. A valve position of an adjustable flow valve operably connected to the first inverter and the second inverter is selected, and a change of the valve position is commanded.

20 Claims, 3 Drawing Sheets

(51) Int. Cl.
 *H02M 1/32* (2007.01)
 *H02M 7/00* (2006.01)

(56) References Cited

U.S. PATENT DOCUMENTS

| | | |
|---|---|---|
| 2019/0351732 A1 | 11/2019 | Rajaie et al. |
| 2021/0026929 A1* | 1/2021 | Zheng .................... H02P 29/68 |
| 2023/0034110 A1* | 2/2023 | Huang .................... B60L 58/26 |
| 2023/0286490 A1* | 9/2023 | Campanaro ............... B60L 3/06 |

* cited by examiner

ACTIVE COOLANT FLOW CONTROL IN MULTI-INVERTER SYSTEMS

INTRODUCTION

The subject disclosure relates to electric vehicle systems, and in particular to cooling of inverters of multi-inverter propulsion systems of electric vehicles.

Increasing numbers of electric vehicles (EVs) are being powered by multi-inverter propulsion systems. Typically, the inverters have different loadings during operation of the EV, and the loading of each of the inverters may change depending on operating conditions of the EV. Each inverter, however, typically receives a fixed portion of a coolant flow relative to the other inverters, often utilizing fixed diameter ratio T-connections to distribute coolant to the inverters. This flow division is not optimized for all operating conditions, and may not be sufficient to cool the inverters, especially in conditions where an inverter is significantly more highly loaded than anticipated when the fixed portion was determined.

SUMMARY

In one embodiment, a cooling system for a drivetrain of an electric vehicle includes a coolant circuit directing a flow of coolant through a first inverter and a second inverter of the drivetrain, and an adjustable flow valve positioned along the coolant circuit to selectably alter proportions of the flow of coolant directed through each of the first inverter and the second inverter.

Additionally or alternatively, in this or other embodiments a coolant pump is positioned along the coolant circuit to urge the flow of coolant through the coolant circuit at a selected coolant flow rate.

Additionally or alternatively, in this or other embodiments a controller is operably connected to the adjustable flow valve to command operation of the adjustable flow valve.

Additionally or alternatively, in this or other embodiments the controller is configured to determine coolant flow rates to the first inverter and second inverter based on a commanded torque and speed of the first inverter and the second inverter, and command adjustment of the adjustable flow valve to direct the coolant flow at the determined coolant flow rates to the first inverter and the second inverter.

Additionally or alternatively, in this or other embodiments the determination of coolant flow rates is based on an effect on net losses of the first inverter and the second inverter with the determined coolant flow rates.

Additionally or alternatively, in this or other embodiments a heat exchanger is positioned along the coolant circuit to reject heat from the flow of coolant.

Additionally or alternatively, in this or other embodiments a ratio of a first coolant flow rate to the first inverter to a second coolant flow rate to the second inverter is up to 5 to 1.

In another embodiment, a vehicle includes a vehicle body, and a drivetrain positioned at the vehicle body. The drivetrain includes a plurality of electric motors configured to drive propulsion of the vehicle, an electric power source operably connected to the plurality of electric motors, and a first inverter and a second inverter operably connected to the electric power source to convert DC power from the electric power source to AC power utilized by the plurality of electric motors. A cooling system includes a coolant circuit directing a flow of coolant through the first inverter and the second inverter, and an adjustable flow valve positioned along the coolant circuit to selectably alter proportions of the flow of coolant directed through each of the first inverter and the second inverter.

Additionally or alternatively, in this or other embodiments a coolant pump is positioned along the coolant circuit to urge the flow of coolant through the coolant circuit at a selected coolant flow rate.

Additionally or alternatively, in this or other embodiments a controller operably connected to the adjustable flow valve to command operation of the adjustable flow valve.

Additionally or alternatively, in this or other embodiments the controller is configured to determine coolant flow rates to the first inverter and second inverter based on a commanded torque and speed of the first inverter and the second inverter, and command adjustment of the adjustable flow valve to direct the coolant flow at the determined coolant flow rates to the first inverter and the second inverter.

Additionally or alternatively, in this or other embodiments the determination of coolant flow rates is based on an effect on net losses of the first inverter and the second inverter with the determined coolant flow rates.

Additionally or alternatively, in this or other embodiments a heat exchanger is positioned along the coolant circuit to reject heat from the flow of coolant.

In yet another embodiment, a method of operating a cooling system for a first inverter and a second inverter of a vehicle drivetrain includes commanding a speed and torque of each of the first inverter and the second inverter, and estimating losses and temperature of each of the first inverter and the second inverter as a result of the commanded speed and torque. A valve position of an adjustable flow valve operably connected to the first inverter and the second inverter is selected, and a change of the valve position to the selected valve position is commanded. A flow of coolant is directed along a coolant circuit and through the first inverter at a first coolant flow rate and through the second inverter at a second coolant flow rate as a result of the valve position of the adjustable flow valve.

Additionally or alternatively, in this or other embodiments the estimated losses and temperature of each of the first inverter and the second inverter are corrected based on a total flow rate of the flow of coolant through the coolant circuit.

Additionally or alternatively, in this or other embodiments estimating losses includes splitting the losses into switching losses and conduction losses.

Additionally or alternatively, in this or other embodiments the valve position is changed only if the selected valve position reduces total net losses of the first inverter and the second inverter.

Additionally or alternatively, in this or other embodiments a coolant pump is operated to urge the flow of coolant through the coolant circuit.

Additionally or alternatively, in this or other embodiments operation of the coolant pump is changed depending on the estimated losses and temperature.

Additionally or alternatively, in this or other embodiments a ratio of the first coolant flow rate to the second coolant flow rate is up to 5 to 1.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
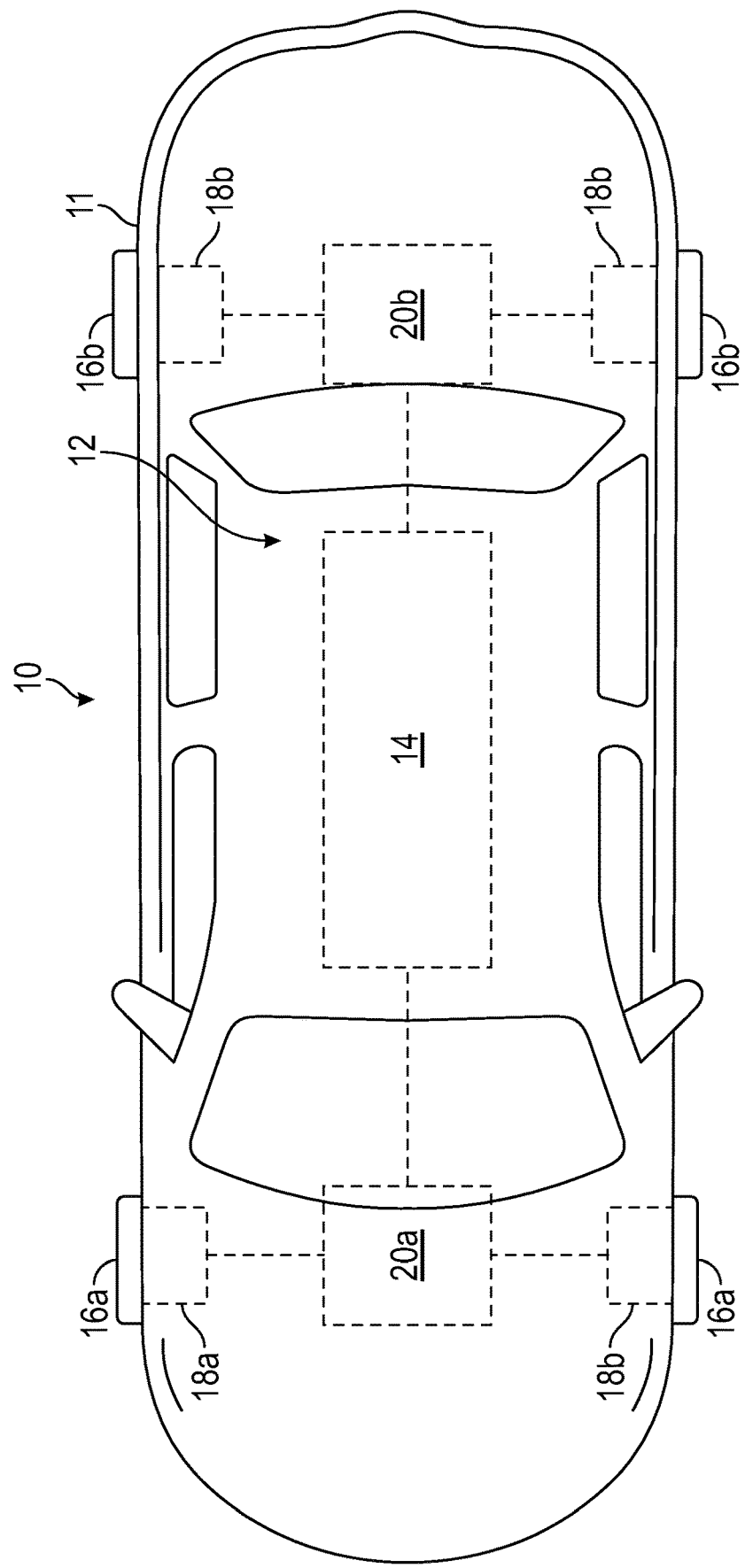
FIG. 1 is a schematic illustration of an embodiment of a vehicle including a drivetrain.

The following description is merely exemplary in nature and is not intended to limit the present disclosure, its application or uses. It should be understood that throughout the drawings, corresponding reference numerals indicate like or corresponding parts and features.

Referring to FIG. 1, shown is an embodiment of a vehicle 10 having a vehicle body 11. The vehicle 10 includes a drivetrain 12 disposed at the vehicle body 11 to transmit power from a power source, such as a plurality of batteries 14 to wheels 16 of the vehicle 10. The drivetrain 12 includes a plurality of electric motors 18 operably connected to the wheels 16 to drive rotation of the wheels 16. A plurality of inverters 20 are located between the plurality of batteries 14 and the plurality of electric motors 18 to convert the DC power from the plurality of batteries 14 to AC power usable by the plurality of electric motors 18. In some embodiments, such as shown in FIG. 1, the vehicle includes a first inverter 20a used to convert electrical power for front electric motors 18a to drive front wheels 16a, and a second inverter 20b to convert electrical power for rear electric motors 18b to drive rear wheels 16b. While two inverters 18a and 18b are described and illustrated herein, one skilled in the art will readily appreciate that the present disclosure may be readily applied to drivetrains 12 having three or more inverters 18.

Figure 2:
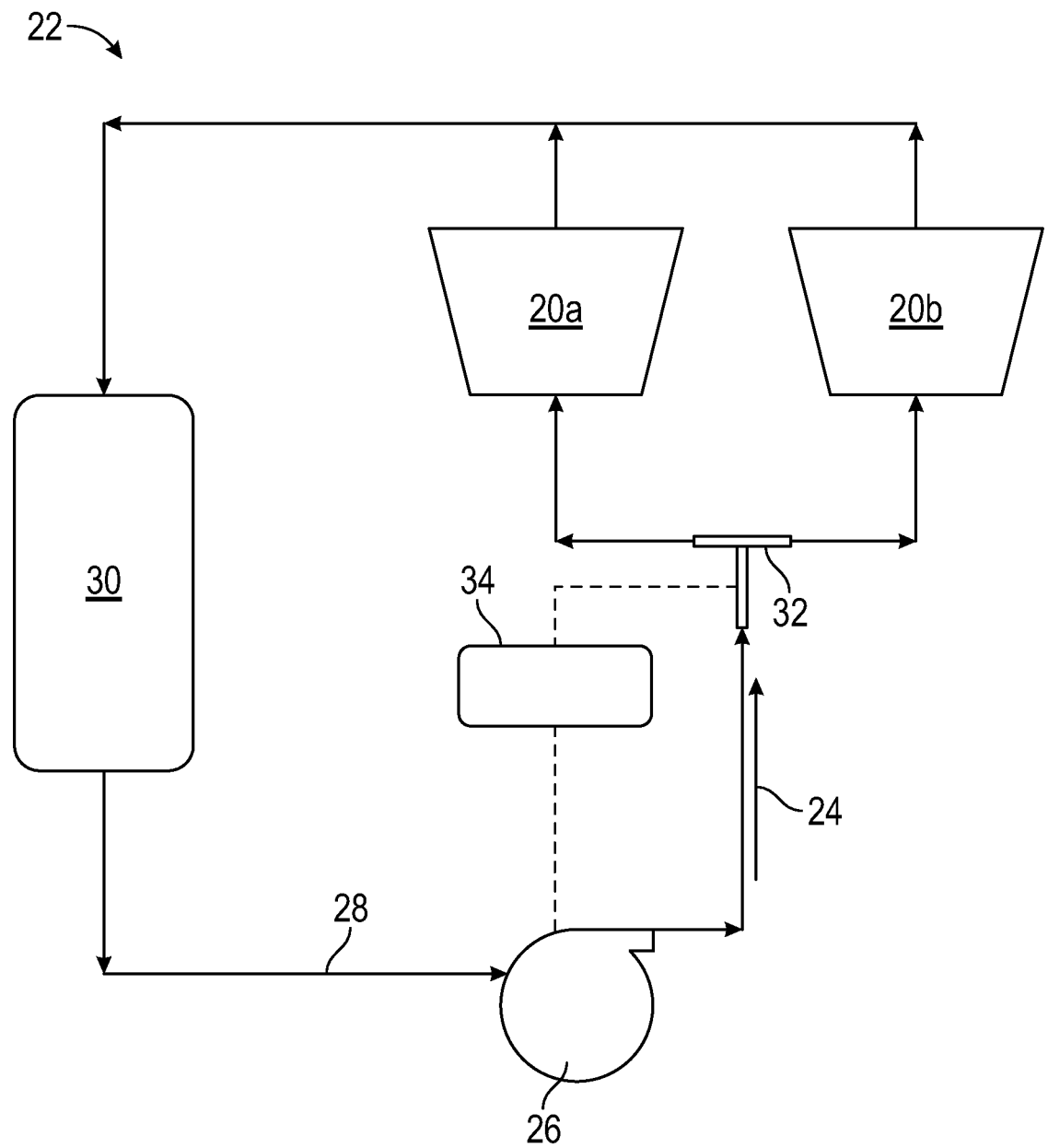
FIG. 2 is a schematic illustration of an embodiment of a cooling system for inverters of the drivetrain.

Referring now to FIG. 2, a cooling system 22 provides a flow of coolant 24 to cool the first inverter 20a and the second inverter 20b. In some embodiments, the flow of coolant 24 is one of an oil, water, glycol, or refrigerant or a mixture thereof. The cooling system 22 utilizes a coolant pump 26 that urges the flow of coolant 24 through a coolant circuit 28. The first inverter 20a and the second inverter 20b are arranged in a fluidly parallel relationship in the cooling circuit 28, and a heat exchanger such as radiator 30 rejects thermal energy from the flow of coolant 24. The cooling circuit 10 further includes an adjustable flow valve 32 positioned fluidly upstream of the first inverter 20a and second inverter 20b. The adjustable flow valve 32 selectable directs the flow of coolant 24 to the first inverter 20a and the second inverter 20b based on the cooling needs of the inverters 20a and 20b. The adjustable flow valve 32, the coolant pump 26 and the inverters 20a and 20b are operably connected to a controller 34. The controller 34 utilizes computation of temperature dependent and independent losses separately. The switching losses are temperature independent or have relatively low temperature dependency and conduction losses are temperature dependent, meaning dependent on a temperature of semiconductors inside the inverters 20a and 20b. The combination of the temperature dependent and independent losses and their sensitivity to change in the inverter temperature is used to divert the flow of coolant 24 to the first inverter 20a and the second inverter 20b based on the result of this computation, via adjustment of the adjustable flow valve 32.

Figure 3:
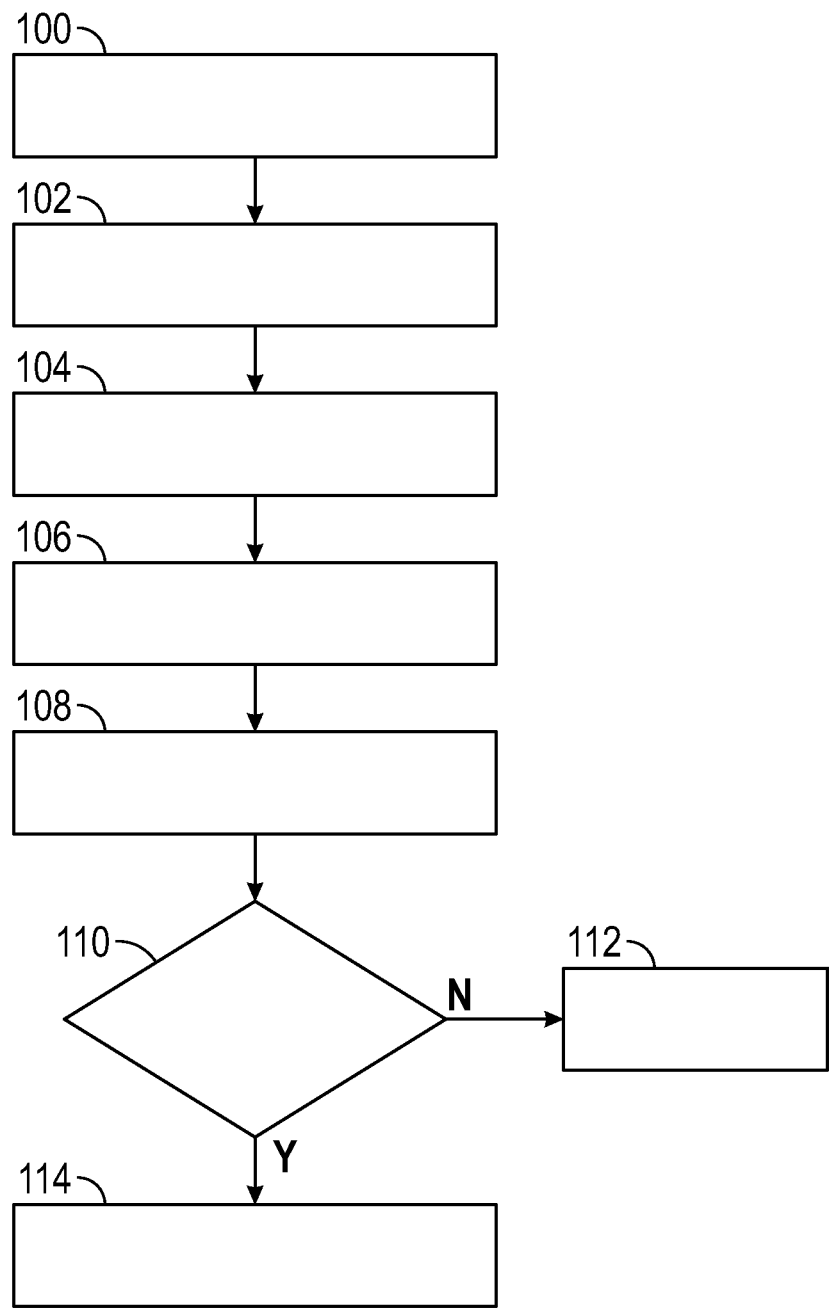
FIG. 3 is a schematic illustration of a method of operating a cooling system for inverters of a drivetrain.

Referring now to FIG. 3, a method of operating the cooling system 22 is schematically illustrated. In some embodiments, the inverters 20a and 20b are wide band gap inverters, where a first part of the losses from operation of the inverters 20a and 20b are temperature dependent losses, and a second part of the losses are independent of temperature of the inverter semiconductors. One skilled in the art, however, will readily appreciate that the described method may be utilized with other types of inverters. At block 100, each inverter 20a and 20b receive a torque and speed command from a drivetrain controller. While in some instances, the torque and speed commands to each inverter 20a, 20b may be the same, in most operating conditions the torque and speed command for the first inverter 20a will be different from the torque and speed command received at the second inverter 20b. At block 102, total losses and temperature for each inverter 20a, 20b are estimated by the controller 34, based on the torque and speed commands. In some embodiments, the controller 34 stores or has access to a table of estimated losses and temperature correlated to torque and speed commands, and utilizes such a table for the estimation. In other embodiments an analytical loss computation method may be used but with temperature dependency. In still other embodiments, a numerical model of the inverters 20a, 20b and the motors 18a, 18b can also be used to compute the loss with temperature accounted for in real-time.

The loss and temperature computation are coupled together which means a change in one leads to a change in another. Due to this, in addition to computing losses with temperature accounted for, the methods also solve heat transfer and thermal models of the inverters 20a, 20b with loss inputs to compute the inverter temperatures. The result of each method is converged for temperature and losses. The losses include a breakdown of temperature dependent and temperature independent losses. The inclusion of cross-coupling of temperature and losses is critical to deciding the coolant flow rates.

At block 104, the losses and temperature estimates are corrected based on flow rate of the coolant 24 from the coolant pump 26, via input from the coolant pump 26 to the controller 34 of pump speed of the coolant pump 26. Due to changing coolant flow rate, the thermal model computes a new temperature estimate. This estimate calculation includes the cross-coupled effect of the changing losses due to the temperature itself. At block 106, the corrected loss estimates are broken down into conduction losses and switching losses. At block 108, a minimum coolant flow rate for reach of the inverters 20a, 20b is determined. The minimum coolant flow rate is the minimum flow rate that will keep the inverters 20a, 20b below a threshold temperature at the commanded torque and speed. The minimum coolant flow rate is compared to the current coolant flow rates, and it is determined whether the minimum coolant flow rates result in a net loss decrease in block 110. At block 112, if it is determined to result in a net loss decrease, the controller 34 commands the coolant pump 26 and the adjustable flow valve 32 to direct the flow of coolant 24 through the inverters 20a and 20b per the minimum coolant flow rates determined in block 108. In some embodiments, a ratio of the flow of coolant to the first inverter 20a relative to the second inverter 20b may be up to 5 to 1. Alternatively, if it is determined that the minimum coolant flow rates will not result in a net loss decrease, the flow of coolant 24 through the inverters 20a, 20b is not changed at block 114.

The flow rate determination increases the flow to the inverter 20a, 20b that has high sensitivity of losses to temperature. By doing so the higher flow rate cools the inverter 20a, 20b to a lower temperature and reduces with positive temperature coefficient losses. For the second inverter from which the flow is diverted away, the second inverter has a reduced sensitivity of losses to temperature so even a slightly low coolant flow and high temperature does not increase the loss. By utilizing this method, the flow rate division is not necessarily based upon total loss ratio of the two inverters.

The system and method disclosed herein allows for more precise control of coolant flow rate through the inverters 20a, 20b, for more efficient operation of the cooling system 22 and the drivetrain 12. This preserves service life of the inverters 20a, 20b and the drivetrain 12. Further, operation of the coolant pump 26 may be reduced, prolonging service life and efficiency of the coolant pump 26.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A cooling system for a drivetrain of an electric vehicle, comprising:
   a coolant circuit directing a flow of coolant through a first inverter and a second inverter of the drivetrain;
   an adjustable flow valve disposed along the coolant circuit to selectably alter proportions of the flow of coolant directed through each of the first inverter and the second inverter; and
   a controller operably connected to the adjustable flow valve to command operation of the adjustable flow valve;
   wherein the determination of coolant flow rates is based on an effect on net losses of the first inverter and the second inverter with the determined coolant flow rates.

2. The cooling system of claim 1, further comprising a coolant pump disposed along the coolant circuit to urge the flow of coolant through the coolant circuit at a selected coolant flow rate.

3. The cooling system of claim 1, wherein the controller is configured to:
   determine coolant flow rates to the first inverter and second inverter based on a commanded torque and speed of the first inverter and the second inverter; and
   command adjustment of the adjustable flow valve to direct the coolant flow at the determined coolant flow rates to the first inverter and the second inverter.

4. The cooling system of claim 1, further comprising a heat exchanger disposed along the coolant circuit to reject heat from the flow of coolant.

5. The cooling system of claim 1, wherein a ratio of a first coolant flow rate to the first inverter to a second coolant flow rate to the second inverter is up to 5 to 1.

6. A vehicle, comprising:
   a vehicle body;
   a drivetrain disposed at the vehicle body including:
   a plurality of electric motors configured to drive propulsion of the vehicle;
   an electric power source operably connected to the plurality of electric motors;
   a first inverter and a second inverter operably connected to the electric power source to convert DC power from the electric power source to AC power utilized by the plurality of electric motors; and
   a cooling system including:
      a coolant circuit directing a flow of coolant through the first inverter and the second inverter;
      an adjustable flow valve disposed along the coolant circuit to selectably alter proportions of the flow of coolant directed through each of the first inverter and the second inverter; and
      a controller operably connected to the adjustable flow valve to command operation of the adjustable flow valve;
      wherein the determination of coolant flow rates is based on an effect on net losses of the first inverter and the second inverter with the determined coolant flow rates.

7. The vehicle of claim 6, further comprising a coolant pump disposed along the coolant circuit to urge the flow of coolant through the coolant circuit at a selected coolant flow rate.

8. The vehicle of claim 6, wherein the controller is configured to:
   determine coolant flow rates to the first inverter and second inverter based on a commanded torque and speed of the first inverter and the second inverter; and
   command adjustment of the adjustable flow valve to direct the coolant flow at the determined coolant flow rates to the first inverter and the second inverter.

9. The vehicle of claim 6, further comprising a heat exchanger disposed along the coolant circuit to reject heat from the flow of coolant.

10. The cooling system on claim 1, wherein the flow of coolant comprises one of an oil, water, glycol, refrigerant or a mixture thereof.

11. The vehicle of claim 6, wherein the flow of coolant comprises one of an oil, water, glycol, refrigerant or a mixture thereof.

12. The vehicle of claim 6, wherein a ratio of a first coolant flow rate to the first inverter to a second coolant flow rate to the second inverter is up to 5 to 1.

13. The vehicle of claim 6, wherein:
   the first inverter is configured to drive front wheels of the vehicle; and
   the second inverter is configured to drive rear wheels of the vehicle.

14. A method of operating a cooling system for a first inverter and a second inverter of a vehicle drivetrain, comprising:
   commanding a speed and torque of each of the first inverter and the second inverter;
   estimating losses and temperature of each of the first inverter and the second inverter as a result of the commanded speed and torque;
   selecting a valve position of an adjustable flow valve operably connected to the first inverter and the second inverter;
   commanding change of the valve position to the selected valve position; and
   directing a flow of coolant along a coolant circuit and through the first inverter at a first coolant flow rate and through the second inverter at a second coolant flow rate as a result of the valve position of the adjustable flow valve.

15. The method of claim 14, further comprising:
   correcting the estimated losses and temperature of each of the first inverter and the second inverter based on a total flow rate of the flow of coolant through the coolant circuit.

16. The method of claim 14, wherein estimating losses includes splitting the losses into switching losses and conduction losses.

17. The method of claim 16, wherein the valve position is changed only if the selected valve position reduces total net losses of the first inverter and the second inverter.

18. The method of claim 14, further comprising operating a coolant pump to urge the flow of coolant through the coolant circuit.

19. The method of claim 18, further comprising changing operation of the coolant pump depending on the estimated losses and temperature.

20. The method of claim 14, wherein a ratio of the first coolant flow rate to the second coolant flow rate is up to 5 to 1.

* * * * *